United States Patent [19]

Morokawa et al.

[11] 3,999,370
[45] Dec. 28, 1976

[54] TEMPERATURE COMPENSATED ELECTRONIC TIMEPIECE

[75] Inventors: Shigeru Morokawa, Tokorozawa; Hashimoto, Yukio, Niiza; Yasuhiko Nishikubo, Iruma, all of Japan

[73] Assignee: Citizen Watch Co., Ltd., Tokyo, Japan

[22] Filed: Dec. 29, 1975

[21] Appl. No.: 645,030

Related U.S. Application Data

[63] Continuation-in-part of Ser. No. 440,240, Feb. 6, 1974, Pat. No. 3,938,316.

[30] Foreign Application Priority Data

| Feb. 10, 1973 | Japan | 48-16720 |
| July 13, 1973 | Japan | 48-79084 |
| July 25, 1973 | Japan | 48-83848 |
| Nov. 26, 1973 | Japan | 48-132380 |

[52] U.S. Cl. .............. 58/23 R; 58/23 A; 331/176
[51] Int. Cl.² .......................... G04C 3/00
[58] Field of Search .......... 58/23 R, 23 A, 23 AC, 58/85.5; 331/176, 116 M; 310/8, 1, 8.9

[56] References Cited
UNITED STATES PATENTS

| 2,811,647 | 10/1957 | Nilssen | 331/176 |
| 3,388,344 | 6/1968 | West | 331/176 X |
| 3,526,853 | 9/1970 | Vittoz | 331/176 X |
| 3,531,739 | 9/1970 | Groves | 331/176 X |
| 3,690,546 | 9/1972 | Uehara | 331/176 |
| 3,713,033 | 1/1973 | Frerking | 331/176 X |
| 3,719,838 | 3/1973 | Peduto et al. | 331/176 X |
| 3,800,523 | 4/1974 | Yamazaki | 58/23 R |

*Primary Examiner*—Ulysses Weldon
*Attorney, Agent, or Firm*—Ernest G. Montague; Karl F. Ross; Herbert Dubno

[57] ABSTRACT

An electronic timepiece has an oscillator whose frequency varies with temperature and whose output is fed through an adder to a time-count unit-signal former that divides this output and feeds it through a counter to a time display. A plurality of transistors are biased so as to switch between conductive and nonconductive states at different respective temperatures, this biasing being effected by means of one resistor or a string of series-connected resistors connected across a constant-voltage source. The transistors are connected to a converter which translates their changes of state into a coded digital signal which is combined with signals from the unit-signal former and fed to the adder to vary the oscillator output frequency in such a manner as to compensate for frequency variations caused by temperature change.

5 Claims, 19 Drawing Figures

TEMPERATURE COMPENSATED ELECTRONIC TIMEPIECE

CROSS-REFERENCE TO RELATED APPLICATION

This application is a continuation-in-part of copending patent application No. 440,240 filed Feb. 6, 1974 now U.S. Pat. No. 3,938,316.

FIELD OF THE INVENTION

This invention relates to a temperature-compensated electronic timepiece comprising a time reference signal generator, where any change of oscillating frequency caused by an external temperature change is automatically compensated.

BACKGROUND OF THE INVENTION

Heretofore, temperature compensation in an electronic timepiece has been effected in an analog manner with the aid of a temperature-sensitive element. For example, it has been proposed to effect the temperature compensation of an oscillator circuit by means of a combination of a temperature-sensitive resistor element and a variable diode or to effect the temperature compensation of an oscillator circuit including a crystal oscillator and incorporated into an integrated circuit by means of a combination of the temperature-sensitive resistor element and a capacitor.

The above-described temperature-compensating device has the disadvantage that the temperature-sensitive resistor element changes considerably after a lapse of time to render the operation of the circuit unstable, i.e. it is difficult to incorporate the circuit element into an integrated circuit, and the compensating characteristic of the temperature sensitive resistor element must be matched with the temperature characteristic of the reference oscillator.

OBJECTS OF THE INVENTION

An object of the present invention is to provide a temperature-compensated electronic timepiece which can effect a stable temperature compensation for a long time.

Another object of the present invention is to provide a temperature-compensated electronic timepiece comprising a temperature-compensating device substantially all the circuit elements of which can be incorporated into an integrated circuit.

BRIEF DESCRIPTION OF THE DRAWING

The invention will now be described in greater detail with reference to the accompanying drawings, wherein.

SPECIFIC DESCRIPTION

Figure 1:
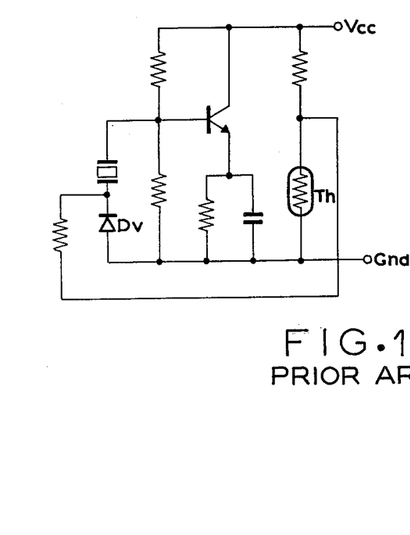
FIGS. 1 and 2 are oscillator circuit diagrams comprising temperature-compensating devices which make use of conventional temperature-sensitive resistor elements.
Figure 2:
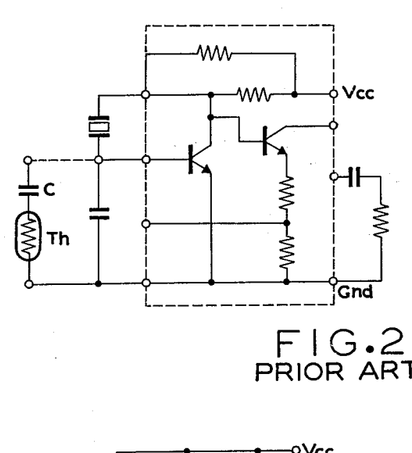

FIG. 1 shows a prior-art oscillator circuit wherein a temperature-sensitive element Th, here a thermistor, and a variable diode Dv are provided automatically to compensate for temperature changes. It is also known as shown in FIG. 2 to provide this thermistor Th for an integrated-circuit oscillator in combination with a capacitor C. The reliance of both of these circuits on a thermistor has proven disadvantages as such circuit elements invariably change characteristics with time so that the temperature compensation becomes incorrect.

Figure 3:
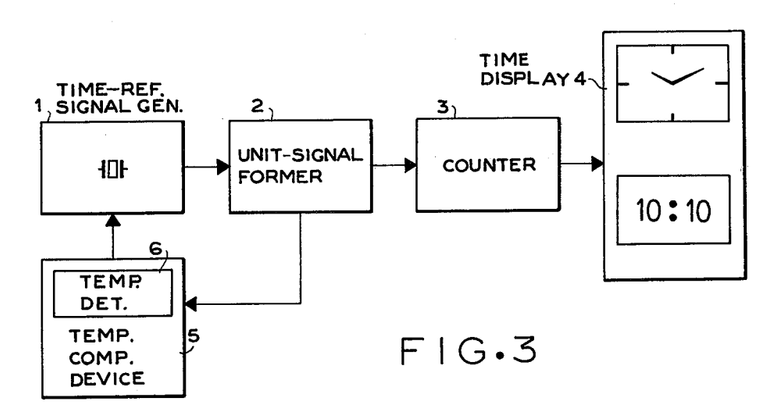
FIGS. 3 and 4 are block diagrams showing different embodiments of the electronic timepiece according to the invention.

In FIG. 3 is shown one embodiment of the temperature-compensated electronic timepiece according to the invention. Reference numeral 1 designates a time reference signal generator for generating a time reference signal; it may, for example, be a crystal oscillator; 2 is a divider for frequency dividing the time reference signal and forming timing pulses necessary for the timepiece, 3 is a time counter for counting the timing pulses and forming a time indication signal, 4 is a time display driven by the output delivered from the time counter 3 and indicating the time, and 5 is a temperature-compensating device provided with a temperature detector 6 and delivering a digital signal whose state is reversed from an initial condition when the temperature exceeds a given temperature.

A temperature-compensating signal is formed on the basis of a signal delivered from the temperature detector and applied to the time reference signal generator 1 to compensate for the variation caused by temperature change in frequency of the output delivered from the time reference signal generator 1. Thus, substantially the same output frequency is delivered from time reference signal generator 1 even when its temperature is changed.

Figure 4:
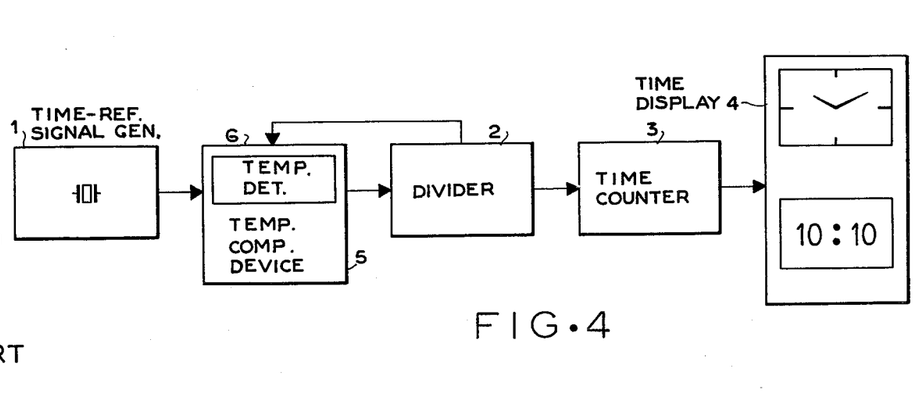

In FIG. 4 there is shown another embodiment of the temperature-compensated electronic timepiece according to the invention. In that embodiment, if the temperature is changed, the output frequency of the time signal generator 1 is changed also. This change of the output frequency is compensated by the temperature-compensating device 5.

The temperature detector 6 provided for the temperature-compensating device 5 will now be described in greater detail.

Figures 5, 6, 7, 8, 17:
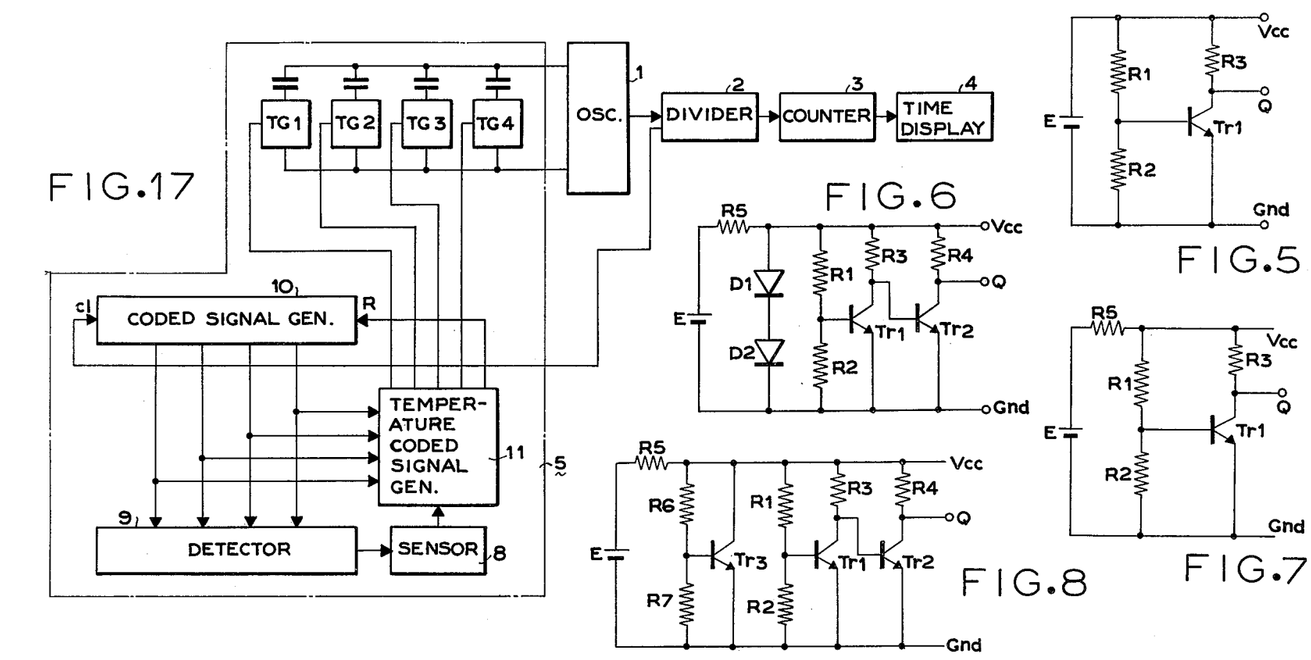
FIG. 5 is a basic circuit diagram showing a temperature detector of the temperature-compensating device adapted for use in the electronic timepiece according to the invention.
FIGS. 6 to 10 are circuit diagrams showing other embodiments of the temperature detector of the temperature-compensating device adapted for use in the electronic timepiece according to the invention.
FIG. 17 is a partial circuit diagram showing in greater detail the embodiment of the electronic timepiece of FIG. 3 according to the invention.

FIG. 5 illustrates a basic circuit of the temperature detector shown in FIGS. 3 and 4. $Tr_1$ designates a transistor used as a temperature-detecting element and composed of semiconductors having different conductivities. The electrical characteristics of the pn junction of transistor $Tr_1$ subjected to a temperature change are given by:

$$I = Is \ (e^{qv/kt} - 1) = Is \cdot e^{qv/kt}$$

where $q$ is the electric charge of an electron, $t$ is an absolute temperature, $k$ is Boltzmann's constant, $v$ is the voltage across the pn junction, and $Is$ is the saturation current flowing through the pn junction in an opposite to normal direction. In FIG. 5, $R_1$ and $R_2$ are base bias resistors, and $R_3$ is a collector resistor.

In the above-described construction of the temperature detector shown in FIG. 5, the transistor $Tr_1$ is used to reverse a two-valued logic signal when its base-emitter voltage Vbe is changed in dependence on a temperature change. Thus, if a voltage dividing ratio between the base bias resistors $R_1$ and $R_2$ is predetermined for the base-emitter voltage Vbe at a given temperature to equal the threshold value of the transistor $Tr_1$, the transistor $Tr_1$ will be in an OFF condition when the temperature does not exceed that given temperature, its collector potential being equal to 1. In the two-valued logic, a high level is a 1 while a low level is a 0. When the temperature exceeds that given temperature, the transistor will be in an ON condition to make the collector potential equal to 0. A collector potential of 0 of the two-valued logic therefore signals a temperature change as described above.

If the current amplification of the transistor $Tr_1$ and the collector resistor $R_3$ are both large and the base bias resistors $R_1$ and $R_2$ are both small the two valued logic signal may rise or decrease sharply. If very small base bias resistors $R_1$ and $R_2$ are selected, the current consumption also increases. In this case, a buffer amplifier may be used as a stage following transistor $Tr_1$ for the purpose of obtaining an effect equivalent to the one described above. In addition, in the event of a power supply voltage variation, a constant voltage circuit may be provided in order to render the two-valued logic signal itself stable irrespective of any temperature change.

FIG. 6 illustrates a modification of the temperature detector circuit shown in FIG. 5. In that embodiment provision is made for a constant voltage circuit composed of diodes $D_1$ and $D_2$ and a resistor $R_5$ connected in series with the power supply source E and for a buffer amplifier composed of a transistor $Tr_2$ and a collector resistor $R_4$ as a stage following transistor $Tr_1$ of the temperature detector shown in FIG. 5. In that embodiment, if the temperature is lower than a given temperature, the transistor $Tr_1$ is in an OFF condition, causing its collector potential to become 1, and as a result, the transistor $Tr_2$ changes to an ON condition rendering its output potential 0. If the temperature exceeds that given temperature, the transistor $Tr_1$ changes to an ON condition to make its collector potential 0, and as a result, the transistor $Tr_2$ is changed to an OFF condition to make its output potential 1. Thus, a logic signal of 1 signals a temperature change as described above.

FIG. 7 shows another modified embodiment of the temperature detector circuit of FIG. 5. In that embodiment, a resistor $R_5$ is connected in series with the power supply source E. That embodiment constitutes not only a simple constant voltage circuit but also a temperature-voltage conversion circuit.

FIG. 8 shows a further modified embodiment of the temperature detector circuit of FIG. 5. In that embodiment, provision is made for a constant voltage circuit composed of a transistor $Tr_3$ and resistors $R_6$ and $R_7$.

Figure 9:
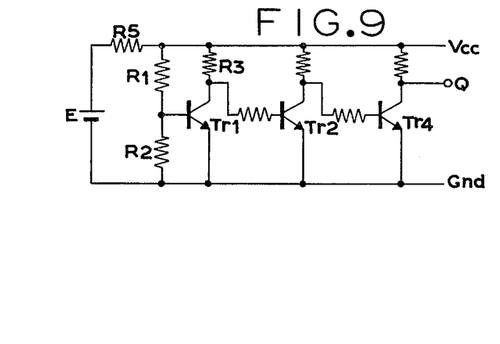

FIG. 9 shows a modification of the temperature detector circuit shown in FIG. 7. In that embodiment, a buffer amplifier composed of transistors $Tr_2$ and $Tr_4$ is added to the temperature detector circuit shown in FIG. 7.

In the above described embodiments, a transistor is used as the temperature detecting element. Such a transistor may, however, be replaced by a diode $D_3$ as shown in FIG. 10.

Figure 10:
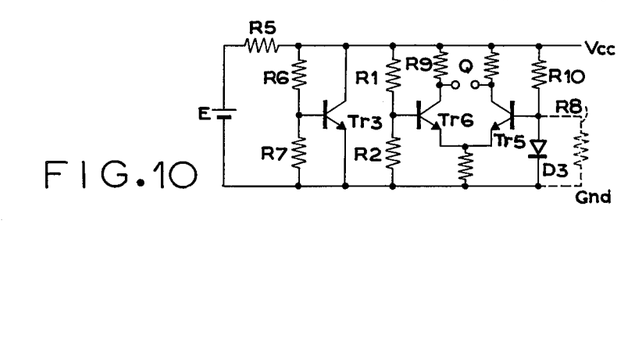

The temperature detector circuit shown in FIG. 10 makes use of a balanced circuit in which the output from a differential amplifier is derived from a single input thereto. A diode $D_3$ more sensitive to temperature variations than a balanced type transistor is connected to the base of a transistor $Tr_5$ instead of a base voltage dividing resistor $R_8$. Thus, the diode $D_3$ serves as a temperature-voltage converter element. A voltage dividing ratio between a resistor $R_{10}$ and the diode $D_3$ is obtained so that the transistor $Tr_5$ is in an ON condition at a temperature higher than a given temperature an in an OFF condition at a temperature lower than that given temperature, and as a result, it is possible to obtain an output from the collector of the transistor $Tr_5$ at a temperature exceeding that given temperature. This output may be fed to a buffer amplifier having a sharply increasing or decreasing output.

Various embodiments of the temperature detector 6 which can deliver a digital signal whose state is reversed from an initial condition at a temperature exceeding a given temperature have been described with reference to FIGS. 5 to 10.

Figure 11:
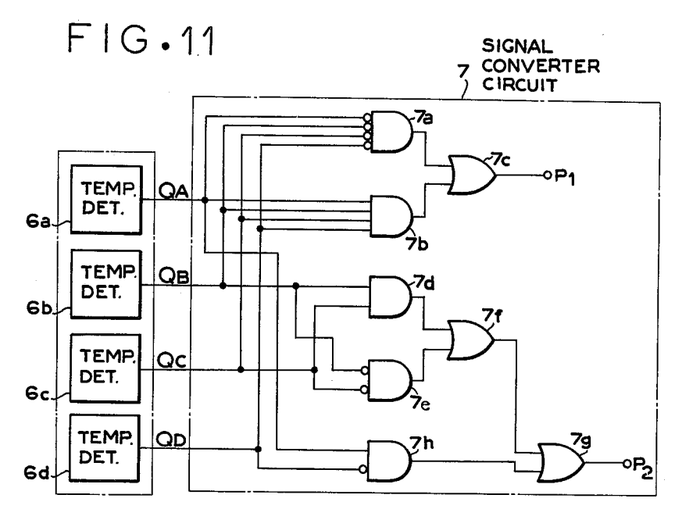
FIG. 11 is a circuit diagram showing a further embodiment of the temperature-compensating device adapted for use in the electronic timepiece according to the invention and comprising a plurality of temperature detectors and a signal converter circuit for controlling the temperature-frequency characteristic to be corrected with the aid of the output signal from the temperature detectors.

Provision may be made for a plurality of temperature detectors 6a, 6b, 6c, and 6d shown in FIGS. 5 to 10, respectively, which can each deliver a digital signal whose state is reversed from respective initial conditions at temperatures exceeding given temperatures, which respectively differ from each other as shown in FIG. 11. The digital signals from the temperature detectors 6a, 6b, 6c and 6d may be fed to a signal converter 7 from which digital coded signals may be derived.

In the temperature detectors 6a to 6d as shown in FIG. 11, let the output of the two valued logic signal 1 be delivered from the output terminal $Q_A$ of the temperature detector 6a at a temperature higher than 10° C, delivered from the output terminal $Q_B$ of the temperature detector 6b at a temperature higher than 20° C, delivered from the output terminal $Q_C$ of the temperature detector 6c at a temperature higher than 30° C and delivered from the output terminal $Q_D$ of the temperature detector 6d at a temperature higher than 40° C, the relation between the temperatures and the output signals delivered from the output terminals $Q_A$ to $Q_D$ being shown in the Table 1 below.

Table 1

|  | $Q_A$ | $Q_B$ | $Q_C$ | $Q_D$ |
| --- | --- | --- | --- | --- |
| Not higher than 10° C | 0 | 0 | 0 | 0 |
| From 10° C to 20° C | 1 | 0 | 0 | 0 |
| From 20° C to 30° C | 1 | 1 | 0 | 0 |
| From 30° C to 40° C | 1 | 1 | 1 | 0 |
| Higher than 40° C | 1 | 1 | 1 | 1 |

The converter 7 comprises an AND gate 7a each of whose inputs is provided with an inverter and is connected to a respective detector output, and an AND gate 7b each of whose four inputs is connected to a respective detector output. The outputs of the gates 7a and 7b are fed to an OR gate 7c whose output $P_1$ is described below. In addition the detectors 6b and 6c have their outputs connected to the inputs of an AND gate 7d and an AND gate 7e, the inputs of the latter being provided with inverters. The outputs of these gates 7d and 7e are connected to an OR gate 7f whose output in turn is fed to an OR gate 7g whose output $P_2$ is described below. The output $Q_A$ of the detector 6a is connected to one input of another AND gate 7h whose output is connected to the other input of OR gate 7g, and the output $Q_D$ of the detector 6d is connected through an inverter to the other input of the AND gate 7h.

In addition, the relation between the signals delivered from the output terminals $Q_A$ to $Q_D$ of the temperature detectors 6a to 6d and the signals delivered from the output terminals $P_1$ and $P_2$ of the signal converter circuit 7 is as shown in Table 2 below.

Table 2

|  | $Q_A$ | $Q_B$ | $Q_C$ | $Q_D$ |  | $P_1$ | $P_2$ | OUTPUT |
| --- | --- | --- | --- | --- | --- | --- | --- | --- |
| Not higher than 10° C | 0 | 0 | 0 | 0 | → | 1 | 0 | 4 Hz |
| From 10° C to 20° C | 1 | 0 | 0 | 0 | → | 0 | 1 | 1 Hz |
| From 20° C to 30° C | 1 | 1 | 0 | 0 | → | 0 | 0 | 0 Hz |
| From 30° C to 40° C | 1 | 1 | 1 | 0 | → | 0 | 1 | 1 Hz |
| Higher than 40° C | 1 | 1 | 1 | 1 | → | 1 | 0 | 4 Hz |

The use of the signals delivered from the output terminals $P_1$ and $P_2$ ensures a constant output frequency from the time reference signal generator 1 shown in FIG. 3 and from divider 2 shown in FIG. 4 irrespective of any temperature change.

The reason why the output frequency from the time reference signal generator 1 shown in FIG. 3 can be made substantially constant irrespective of any temperature change will now be described with reference to FIG. 12.

Figure 12:
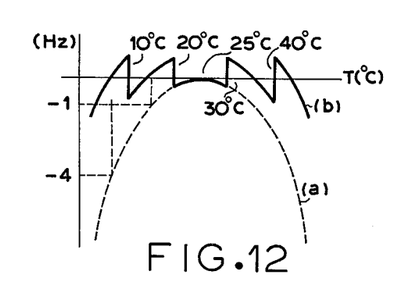
FIG. 12 graphically represents the temperature-frequency characteristics of the time reference signal generator.

In FIG. 12 there are graphically represented a temperature-frequency characteristic of time reference signal generator 1 shown in FIG. 3.

Let the temperature-frequency characteristics of the time reference signal generator 1 shown in FIG. 3 be the dashed line (a) of FIG. 12. The use of signals delivered from the output terminals $P_1$ and $P_2$ of the signal converter circuit 7 and having frequencies of 4 Hz at a temperature not higher than 10° C, 1 Hz at a temperature from 10° C to 20° C, 0 Hz at a temperature from 20° C to 30° C, 1 Hz at a temperature from 30° C to 40° C and 4 Hz at a temperature higher than 40° C, respectively, makes it possible to compensate and change the temperature-frequency characteristic curve (a) into a temperature-frequency characteristic curve (b) shown by a solid line in FIG. 12. The temperature-frequency characteristic curve (a) shown in FIG. 12 therefore changes every 10° C. But, if the number of temperature detectors 6 is increased, the temperature-frequency characteristic (a) may be changed every 5° C, the precision of temperature compensation therefore increasing.

In the embodiments shown in FIGS. 5 to 12, use has been made of a temperature detecting element in which a temperature-voltage converting element such as a transistor, a diode and the like is composed of semiconductors having different conductivities. Use may also be made of an element composed of a conductor and a semiconductor joined thereto as the temperature-voltage converting element, such as, for example, a Schottky diode.

Further embodiments of temperature detector 6 will now be described.

Figure 13:
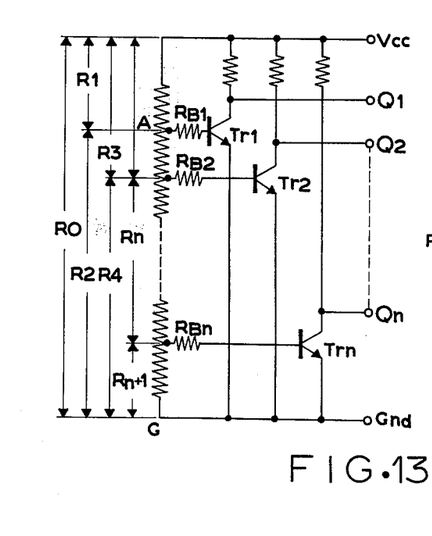
FIGS. 13 and 14 are circuit diagrams showing other embodiments of the temperature detector adapted for use in the electronic timepiece according to the invention.

In FIG. 13 there is shown a temperature detector comprising a plurality of transistors $Tr_1$, $Tr_2$, ... $Tr_n$ whose bases are connected through resistors $R_{B1}$, $R_{B2}$, ... $R_{Bn}$ and sliders to various points of a voltage divider resistor network or potentiometer $R_O$.

The common voltage divider network $R_O$ is divided into sections $R_1$ and $R_2$ by the slidable contact of the base resistor $R_{B1}$ of transistor $Tr_1$ so that the base-emitter voltage $V_{BE}$ of the transistor $Tr_1$ is equal to the threshold value of the transistor $Tr_1$ at a given temperature.

The common voltage divider network $R_O$ is also divided into sections $R_3$ and $R_4$ by the slidable contact of the base resistor $R_{B2}$ of the transistor $Tr_2$ so that the base-emitter voltage $V_{BE}$ of the transistor $Tr_2$ is equal to the threshold value of the transistor $Tr_2$ at a different given temperature. Similarly, the common base voltage divider network $R_O$ is divided into a section $R_n$ and a section $R_{n+1}$ by the slidable contact of the base resistor $R_{Bn}$ of the transistor $Tr_n$ so that the base-emitter voltage $V_{BE}$ of the transistor $Tr_n$ is equal to the threshold value of the transistor $Tr_n$ at another different given temperature. If the temperature is lower than the given temperatures for all of the transistors $Tr_1$, $Tr_2$, ..., $Tr_n$ all of these transistors assume an OFF condition and their collector potentials become 1.

If the temperature rises to the given temperature for the transistor $Tr_1$, the transistor $Tr_1$ only changes to an ON condition to make its collector potential 0.

In this case, all of the other transistors are OFF and their collector potentials are held at 1.

If the temperature rises higher and arrives at a given temperature defined for the transistor $Tr_2$, the transistor $Tr_2$ changes to an ON condition, rendering its collector potential 0. In this case, all of the other transistors except transistors Tr₁ and Tr₂ are in an OFF condition, and as a result digital signals whose states are reversed from their respective initial conditions are delivered in succession.

If the transistor Tr₁ changes to an ON state the resistor R₂ between the slidable contact A and the ground G is connected in parallel with the base resistor $R_{B1}$ of the transistor Tr₁. In order to make such parallel resistors substantially equal to the resistor R₂, the base resistor $R_{B1}$ is selected such that $R_{B1} >> R_2$. Then, the combined resistance of the parallel resistors is given by $$\frac{R_2 \times R_{B1}}{R_2 + R_{B1}} = \frac{R_2}{R_2/R_{B1} + 1} \approx R_2$$

and hence becomes substantially equal to R₂.

Figure 14:
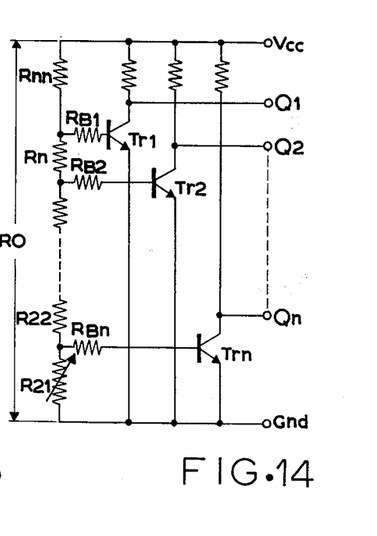

The common voltage divider network $R_O$ may be composed of a plurality of fixed resistors $R_{21}$, $R_{22}$, $\cdots$ $R_n$, and $R_{n+n}$ as shown in FIG. 14.

If the common base bias resistor $R_O$ shown in FIGS. 13 and 14 is a fixed resistor, it is only possible to effect temperature compensation for a time-reference-signal generator having a given temperature-frequency characteristic. On the contrary, if at least a part of the common base bias resistor $R_O$ is made variable, it is possible to effect temperature compensation for a time reference signal generator having any desired temperature-frequency characteristics.

Figure 15:
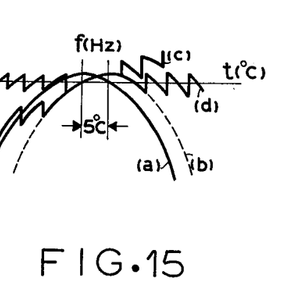
FIG. 15 graphically represents the temperature-frequency characteristics of the time reference signal generator.

That is, if respective individual resistance values of common voltage-divider network $R_O$ are fixed, it is only possible to effect temperature compensation for a time reference signal generator having a temperature-frequency characteristic curve (a) shown as a solid line in FIG. 15. But, if this temperature detector is used to effect temperature compensation for a time reference signal generator having a temperature-frequency characteristic curve (b) whose zero temperature coefficient deviates from that of the temperature-frequency characteristic curve (a) by 5° C as shown by a dashed line in FIG. 15, the temperature-frequency characteristic curve (b) is changed into a temperature-frequency characteristic curve (c), thereby rendering a highly precise temperature compensation impossible.

If at least a part of common voltage divider network $R_O$, such as, for example, the resistor $R_{21}$ shown in FIG. 14 is made variable or replaced by another resistor, the temperature-frequency characteristic curve (c) can be corrected to a temperature-frequency characteristic curve (d) as shown in FIG. 15.

The electronic timepiece can be temperature compensated by means of a temperature-compensating device comprising a temperature detector having a temperature-sensitive element and a coded signal generator. The temperature detector may include only one temperature-detecting element and deliver a digital signal whose state is reversed from an initial condition at a temperature higher than a plurality of respective temperatures.

Figure 16:
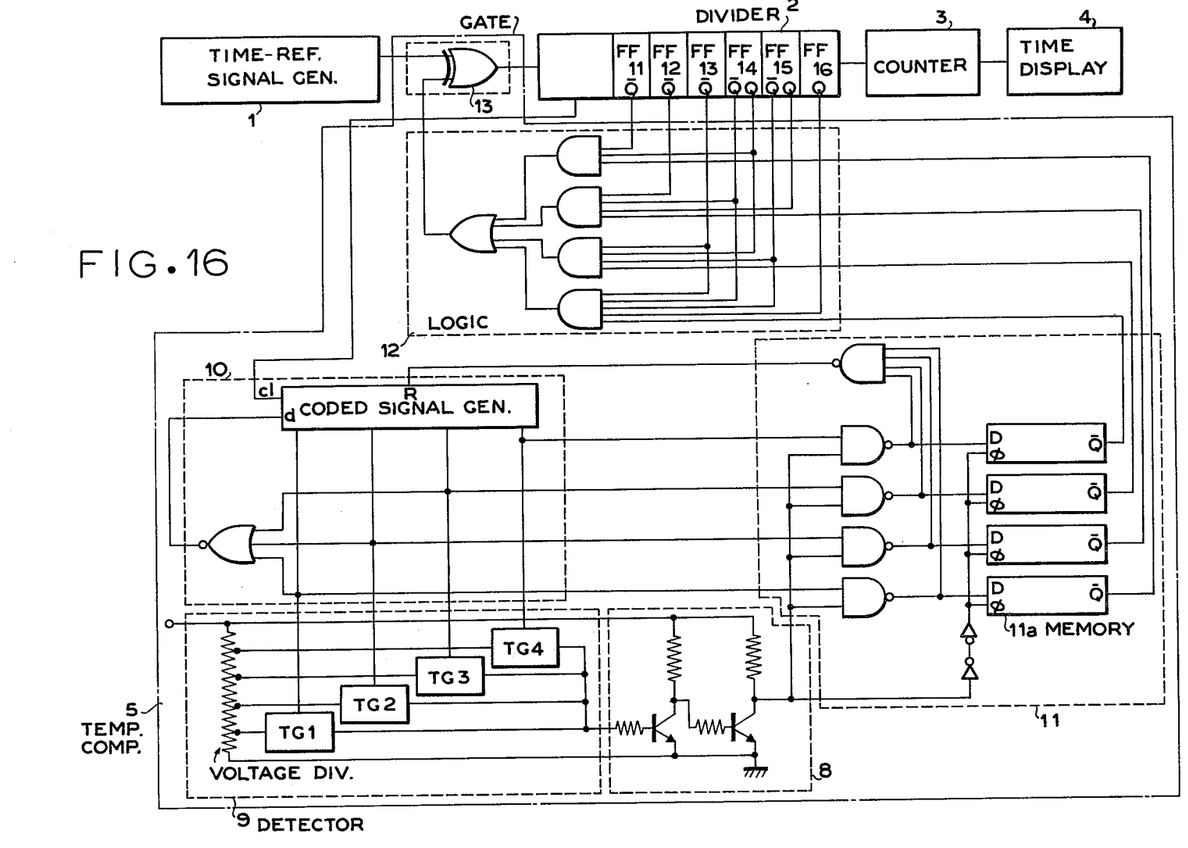
FIG. 16 is a circuit diagram showing in greater detail the embodiment of the electronic timepiece according to the invention shown in FIG. 4.

FIG. 16 shows in greater detail a circuit of the temperature compensated electronic timepiece of FIG. 4. In FIGS. 4 and 16 the same reference numerals are used to designate equivalent parts.

The temperature-compensating device 5 shown in FIG. 16 comprises a temperature sensing device 8 including only a temperature-detecting element such as shown in FIG. 6, a voltage generator 9 for supplying a voltage for determining a detection temperature, a coded signal generator 10 including a shift register for controlling the output voltage from the voltage generator 9, a temperature coded signal discriminator 11 for forming a temperature coded digital signal from the output signals of temperature sensing device 8 and of coded signal generator 10 and for memorizing the temperature-coded signal, a frequency control circuit 12 for forming narrow pulse signals from the output signals of the temperature-coded-signal discriminator 11 and the divider 2, and a frequency adder circuit 13 for adding the output signal from the frequency-control circuit 12 to the output signal from the time-reference-signal generator 1.

The operation of the temperature-compensated electronic timepiece shown in FIG. 16 is as follows:

The coded signal generator 10 includes a shift register R which delivers no data output from any of its output terminals when in an initial condition during which input clock pulses are absent. When input clock pulses are present, the data pulse outputs are shifted in succession in response to the number of the input clock pulses.

The data pulse outputs thus shifted are delivered to the detection-temperature-determining-voltage generator 9 so as to control electronic switches such as transmission gates TG₁, TG₂, TG₃, TG₄ and the like, and as a result, a voltage is delivered from the detection temperature determining voltage generator 9 to temperature sensing device 8.

At a given temperature, i.e. if a voltage which is equal to a boundary voltage which reverses the initial condition of the temperature-sensing device 8 is delivered from detection-temperature-determining-voltage generator 9 to temperature sensing device 8, an output signal is delivered from temperature-sensing device 8 to temperature coded signal discriminator 11 which recognizes the output signal from each shift register stage of coded signal generator 10 as a temperature-coded signal which is then stored in a memory circuit 11a. Then a reset signal is delivered from temperature-coded-signal discriminator 11 to the shift register to reset the latter, thereby returning coded signal generator 10 to its initial condition readying it for a next temperature detection.

The temperature-coded signal memorized by the memory circuit 11a is retained therein until a subsequent temperature coded signal arrives at the memory circuit. Then the temperature coded signal is delivered to one terminal of one of the AND gates of frequency control circuit 12.

The other terminals of the AND gates of frequency-control circuit 12 are supplied with outputs from divider 2. Narrow pulses deviating in phase from each other are delivered from the AND gates through an OR gate to one of the input terminals of an EXCLUSIVE-OR-gate 13 whose other input terminal is connected to the output terminal of the time-reference-signal generator 1 thus causing frequency addition.

In general, the frequency-temperature characteristic curve of the time reference signal generator 1, that is an oscillator circuit comprising an oscillator having an electro-mechanical converter as for example a crystal oscillator or the like is graphically represented by a curve of second or third degree. Thus, if the oscillation frequency at a given temperature is lower than the ideal frequency which is a divided reference signal frequency having a minimum time period used in practice for counting, the output frequency of divider 2 becomes substantially equal to the ideal desired frequency and is delivered to time counter 3.

In the embodiment shown in FIG. 16, the temperature coded signal is repeatedly supplied to the AND gates of the frequency control circuit 12. Provision may be made for a timer to sample the temperature coded signal for the purpose of economizing power.

As above described, the electronic timepiece shown in FIG. 16 is constructed so that when any temperature change occurs the output frequency from the time reference-signal generator 1 is varied, but the output frequency from the divider 2 is kept substantially at a frequency equal to that prior to the occurrence of the temperature change.

FIG. 17 is a block diagram of the temperature-compensated electronic timepiece of FIG. 3 constructed so that when any temperature change occurs the output frequency from the time reference signal generator 1 is kept substantially at a frequency equal to that prior to the occurrence of the temperature change. In FIGS. 3 and 17 the same reference numerals are used to designate the same parts.

If input clock pulses are supplied to a coded signal generator 10 composed of a counter circuit, binary logic digital signals are delivered from the output terminals of the counting states to a detection-temperature-determining-voltage generator 9 composed of a D-A converter.

The D-A converter is comprised of a ladder-shaped resistor circuit which can successively change the amount of voltage.

In the voltage supplied from the detection-temperature-determining-voltage generator 9 to a temperature-sensing device 8 at a given temperature coincides with the boundary voltage which delivers a two-valued logic digital signal whose state is reversed from the initial condition, the output from the temperature sensing device 8 is delivered to one of the input terminals of the gate circuit of a temperature-coded-signal discriminator 11. In addition, the outputs from the respective stages of the counter 10 are supplied to the other input terminals of the temperature-coded-signal discriminator 11, and as a result, the temperature-coded signal corresponding to a given temperature is fed from the temperature-coded-signal discriminator 11 to a memory circuit provided therefor and stored therein until a next temperature-coded signal arrives at the memory circuit. This temperature-coded signal serves as a control signal for changing the time-determining capacity element of the time-reference-signal generator 1 with the aid of electronic switches such as transmission gates $TG_1$, $TG_2$, $TG_3$, $TG_4$ and the like. Thus, the electronic timepiece shown in FIG. 17 is capable of changing the time-determining capacity element of the time reference signal generator 1 when subjected to any temperature change and hence the output therefrom, and of delivering a frequency which is substantially equal to the frequency generated by time reference signal generator 1 if its temperature were to be held constant, which is then fed to time counter 3.

FIG. 11 shows a temperature detector 6 and a signal converter 7 for controlling a correction frequency amount in a temperature-compensating device 5 wherein the output signal is the same temperature-coded signal as that of a temperature-coded-signal discriminator 11 as shown in FIGS. 16 and 17.

FIG. 3 shows an embodiment wherein the output signal from a time-count-signal-forming mechanism 2 is used as the input signal of a timer circuit so that a temperature-coded signal may be obtained in a sampling mode.

FIG. 4 shows the input signal at one terminal of frequency-control circuit 12.

In a detecting-temperature-determining-voltage generator 9, a voltage amount delivered to a temperature-sensitive means 8 is changed by means of a digital-analog converter and its output is applied to one input terminal of a GATE circuit in the temperature-coded-signal discriminator 11 from the temperature-sensitive device 8 at the voltage corresponding to the actual temperature. Furthermore the outputs of respective stages of a coded signal generator 10 are applied to the other input terminal of the respective temperature-coded-signal discriminators 11. Therefore the basic difference of FIGS. 16 and 17 exists in the point that the former delivers the predetermined voltage by a switch and the latter delivers it by a digital-analog converter.

Figure 18:
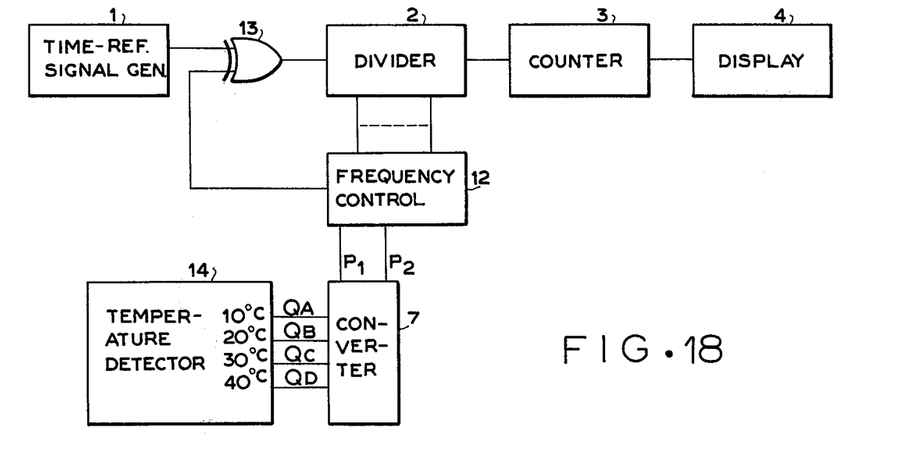
FIGS. 18 and 19 are circuit diagrams illustrating further arrangements in accordance with the present invention.

The arrangement shown in FIG. 18 uses reference numerals identical to numerals used elsewhere where circuitry is effectively identical. Thus the time-reference signal generator 1 is connected through the mixer or adder 13 (FIG. 16) to a divider 2 and thence to a counter 3 and a display 4 as described earlier.

A temperature detector 14 identical to that described in FIG. 13 or in FIG. 14 has its four outputs $Q_A$ - $_D$ connected to a converter 7 as shown in FIG. 11. The outputs $P_1$ and $P_2$ of this element are connected to a frequency control circuit which generates narrow pulses from the output signals of the converter 7 and the divider 12 and feeds them to the adder 13.

Figure 19:
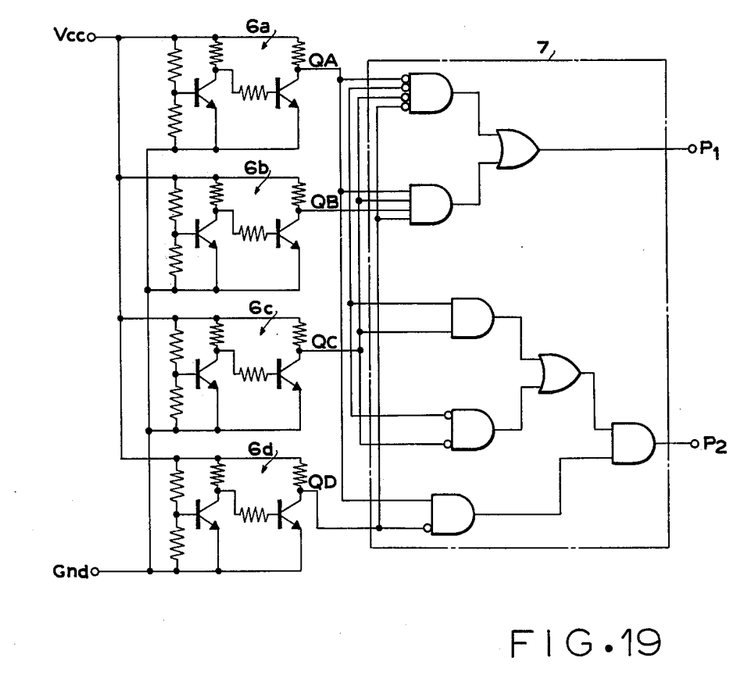

FIG. 19 shows how four detectors 6a, 6b, 6c, and 6d as shown in FIG. 6 can be connected with the converter 7 of FIG. 11.

As stated hereinafter, the electronic timepiece according to the invention has the advantage that it can be reliably temperature compensated, can operate in a stable state for a long time even when subjected to external temperature changes and that almost all circuit elements of the temperature-compensating device can be incorporated into an integrated circuit, thereby making it small in size.

We claim:

1. In an electronic timepiece wherein a time reference signal having a frequency varying with temperature from an ideal frequency is generated by an oscillator and fed to a time-count unit-signal former that divides the time reference signal into time-count unit signals that are fed to and counted by a time counter to form a time-indicating signal that is in turn supplied to a display that gives a visual representation of time in response to the time-indicating signal, the improvement comprising a temperature variation compensator including:

a plurality of temperature detectors including a plurality of transistors and a plurality of biasing networks each connected to a respective transistor for switching over of each of said transistors from one digital state to another digital state on the respective junction of the respective transistor being at a temperature exceeding a respective predetermined threshold temperature, each threshold temperature being different from every other threshold temperature;

converter means connected to all of said transistors for translating the changes of state of said transistors into a coded digital signal;

frequency control means connected to said converter means and to said unit-signal former for receiving said coded digital signal and said time-count unit signals and for forming therefrom narrow pulses; and adding means including an EXCLUSIVE-OR gate connected between said oscillator and said unit-signal former and connected to said frequency control means for receiving said pulses and compensating for frequency variations from said ideal frequency caused by temperature changes.

2. The improvement defined in claim 1, further comprising a constant-voltage source, said biasing networks comprising at least one resistor connected across said source and having a plurality of taps each connected to the bases of said transistors.

3. The improvement defined in claim 2 wherein said taps are displaceable along said resistor.

4. The improvement defined in claim 2 wherein said resistor is formed of a succession of series-connected resistances joined at junctions constituting said taps.

5. The improvement defined in claim 4 wherein at least one of said resistances is variable.

* * * * *